United States Patent [19]

Suh et al.

[11] Patent Number: 4,687,274
[45] Date of Patent: Aug. 18, 1987

[54] ELECTRICAL CONTACTS

[75] Inventors: Nam P. Suh, Sudbury; Nannaji Saka; Ming J. Liou, both of Cambridge, all of Mass.

[73] Assignee: Massachusetts Institute of Technology, Cambridge, Mass.

[21] Appl. No.: 609,022

[22] Filed: May 10, 1984

[51] Int. Cl.⁴ .......................................... H01R 11/02
[52] U.S. Cl. .................................... 439/426; 439/77; 439/886
[58] Field of Search ............... 339/95, 17 F, 278 M, 339/17 CF, 17 N, 17 LC, 278 C

[56] References Cited

U.S. PATENT DOCUMENTS 3,796,986  3/1974  Tamburro .................. 339/278 C
3,853,382 12/1974  Lazar ........................ 339/278 C
4,125,310 11/1978  Reardon, II et al. .......... 339/17 F
4,431,242  2/1984  Gisewsky ..................... 339/48

Primary Examiner—Gil Weidenfeld
Assistant Examiner—Paula A. Austin
Attorney, Agent, or Firm—Robert F. O'Connell

[57] ABSTRACT

A pair of elements for providing slidable electrical contact therebetween wherein the contact surface of at least one of the elements comprises a plurality of contact portions and a plurality of depressed portions in between the contact portions so that wear particles which are generated between their contact surfaces as the elements are moved relative to each other are effectively swept from between the contact surfaces into the depressed portions where they are entrapped. Such operation tends to maintain a low electrical resistance between the elements over many cycles of use.

14 Claims, 7 Drawing Figures

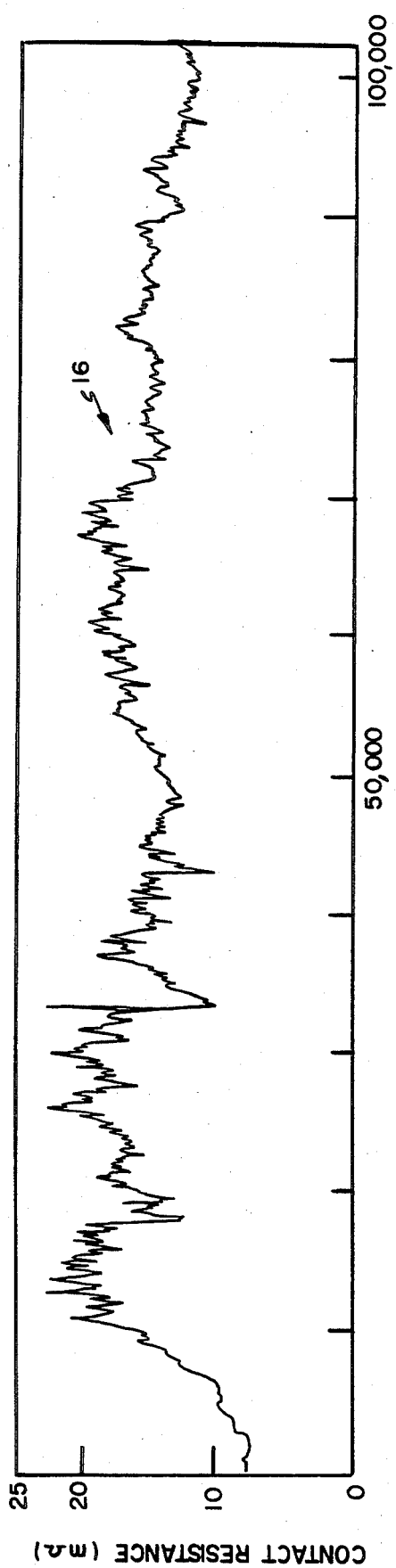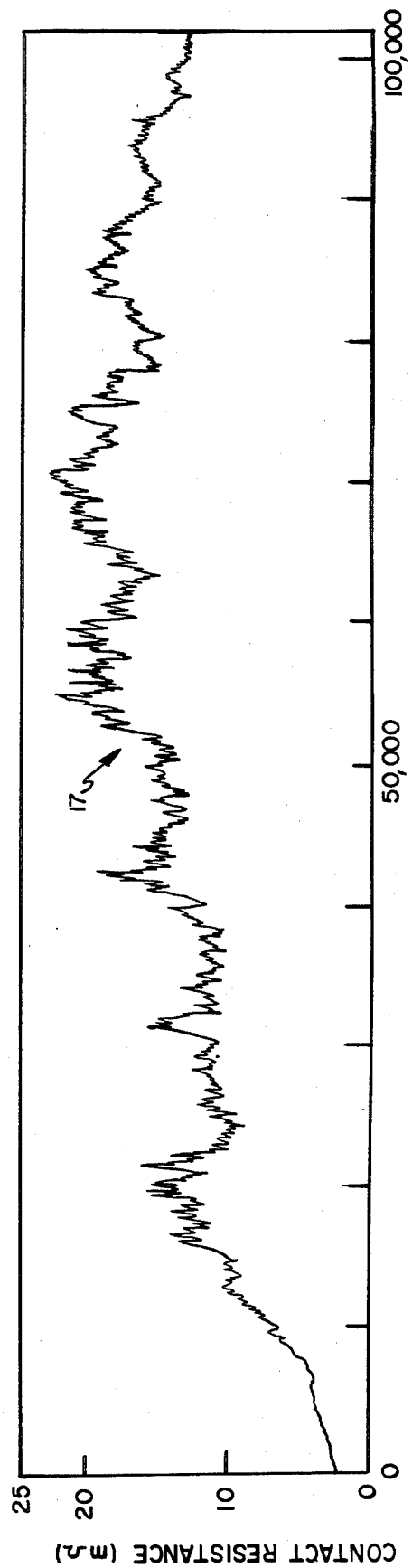

ELECTRICAL CONTACTS

INTRODUCTION

This case relates generally to the treatment of materials used for electrical contacts, for example, and, more particularly, to an improved design for increasing the reliability and life of such material during use.

BACKGROUND OF THE INVENTION

In many applications in which certain materials are used in the fabrication of electrical connectors, for example, a need has arisen for more stringent requirements so as to provide better reliability and longer life at reasonable cost. For example, the rapid growth of the information and communications industries over the past decade has led to an increased use of "edge-card" connectors in both computers and other instruments. Such connectors are inserted and removed many times during the course of their life and in addition are usually subject to small amplitude oscillatory motions (sometimes referred to as "fretting") during use. Such operations cause the contact surfaces of such connector to wear and in the course thereof minute wear particles of the surface material are generated, most or all of which particles are retained in the region between the surfaces of the connector elements.

Over the course of time such wear particles will oxidize as the sliding and/or fretting motions continue. As a result the sliding surfaces of the connector tend to become separated by the oxidized, electrically insulative particles and the contact resistance between the connector elements is increased to levels above generally acceptable values. When this occurs, the resistance also tends to fluctuate widely which in turn creates spurious noise.

It is desirable, therefore, to design electrical connectors which overcome the contact resistance problems which arise because of the generation of wear particles during use and to provide such connectors at a reasonable cost.

DESCRIPTION OF THE PRIOR ART

One approach to the wear particle problem in electrical connectors has been to utilize a layer of noble metal on the contact surfaces of the connector elements. Because noble metals will not oxidize over the time period of use, the noble wear particles do not tend to increase the contact resistance as would occur if the particles were made of a non-noble metal, e.g., copper. In such an approach the high-conductivity copper material often has a layer of nickel applied thereto, which layer in turn has applied thereto another layer of a noble metal or a noble metal alloy, e.g., gold (Au), gold-cobalt (Au-Co) or other gold alloys, or platinum, palladium, iridium, or alloys thereof. The thickness of the layer and hardness of the material must be sufficient so as not to wear down too rapidly during the useful life of the connector.

Notwithstanding the electrical advantages offered by such noble metal or noble metal alloys, such electrical connectors have become prohibitively expensive, particularly as the price of gold or other noble metals has increased over the years. It is desirable therefore to find a different approach which will still provide the desired low contact resistance and high reliability but will do so at a reasonable cost.

BRIEF SUMMARY OF THE INVENTION

In accordance with a preferred embodiment of the invention, a connector for providing slidable electrical contact between two elements thereof is fabricated so that at least one of the elements has a surface which comprises a first plurality of raised portions (or islands) and a second plurality of depressed portions (or valleys) therebetween. The raised portions are capable of making electrical contact with the surface of a second element, the first and second elements being relatively movable with respect to each other. As the contact elements are moved relative to each other, either in the course of the insertion and removal of one element with respect to the other or in the course of use when small vibrational or fretting motion occurs, such motions generate tiny wear particles from the surfaces of the elements, which particles are then entrapped in the depressed portions and thereby removed from the surface contact regions between the raised portions of the one element and the contact surface of the other element during the relative motion of the contact elements. Such removal prevents such particles from being retained between the contact surfaces and ultimately becoming oxidized and raising the contact resistance between such surface contact regions.

By using such a unique structural configuration the contact resistance between the contact regions of the elements remains well below acceptable maximum levels and the connector has an increased useful life. Because of such structure the surfaces of the contact elements need not be made of noble metals or noble metal alloys and the overall cost of the device can be kept within reasonable limits. The pattern of raised and depressed portions can be formed in any suitable manner such as by using known photo-resist techniques or by mechanical means.

DESCRIPTION OF THE INVENTION

The invention can be described in more detail with the help of the accompanying drawing wherein FIG. 1 shows a view in cross section of a portion of the surfaces of a pair of contact elements of a connector in accordance with the invention;

FIGS. 4 and 4A show graphs of contact resistance test results for simulated fretting motions.

Figure 1:
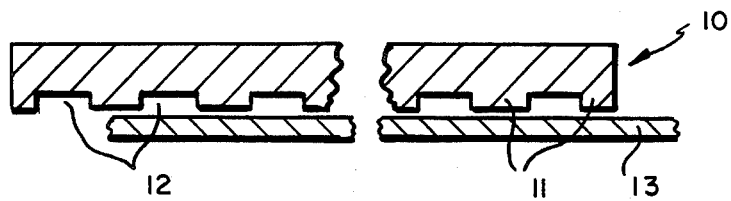
FIG. 1A shows an alternative embodiment of that shown in FIG. 1.

As can be seen in FIG. 1 the surface of a contact element 10 comprises a plurality of raised portions (islands) 11 and a plurality of depressed portions (valleys) 12 therebetween. The raised portions make mechanical and electrical contact with a second contact element 13 having a substantially smooth surface as shown. As the elements 10 and 13 move relative to each other, as shown by the arrow, the contact surface regions between the raised portions 11 of element 10 and the surface of element 13 tend to generate minute wear particles which would normally tend to be retained between the surface contact regions. In accordance with the invention, however, as movement occurs, such wear particles are swept into and entrapped in depressed portions 12 where they are retained.

Figure 2:
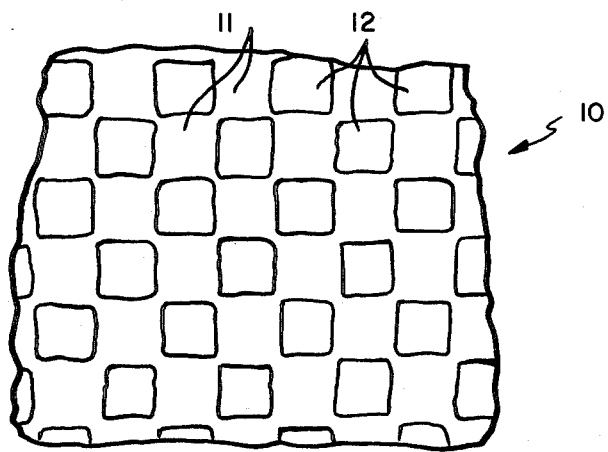
FIG. 2 shows a plan view of an exemplary surface of one of the contact elements of FIG. 1.

In a preferred and exemplary embodiment of the invention, for example, the raised or island portions 11 can be formed, as shown in FIGS. 1 and 2, as 100 micrometer (μm.) square islands separated by 100 μm. square depressed or valley regions 12 having depths of about 100 μm, thereby forming a substantially regular pattern thereof as shown.

In the exemplary embodiment shown the pattern of islands and valleys can be formed by any suitable process such as, for example, by using well-known photoresist techniques, wherein the depressed portions can ultimately be formed by etching or the islands can ultimately be formed by plating, in accordance with a desired pattern thereof. Alternatively, the pattern may be formed by an appropriate mechanical embossing process in which the pattern is formed by using a suitably configured embossing cylinder.

In a preferred embodiment the plated regions can be plated with a selected material having a selected thickness which provides relatively low electrical resistance and a selected hardness which provides relatively low wear characteristics. For example, as shown in FIG. 1A, copper islands 11 of the patterned surface can be plated with nickel using an electroless plating process to form a layer 11A of a thickness selected to provide relatively low electrical resistance (e.g. about 3.75 μm.) on each island as the contact surface region. In order to prevent corrosion of the nickel coating, the surface can be further coated with a layer 11B of a lead-tin (Pb-Sn) alloy using various thicknesses from about 0.1 μm. to about 2.0 μm.

Figure 3:
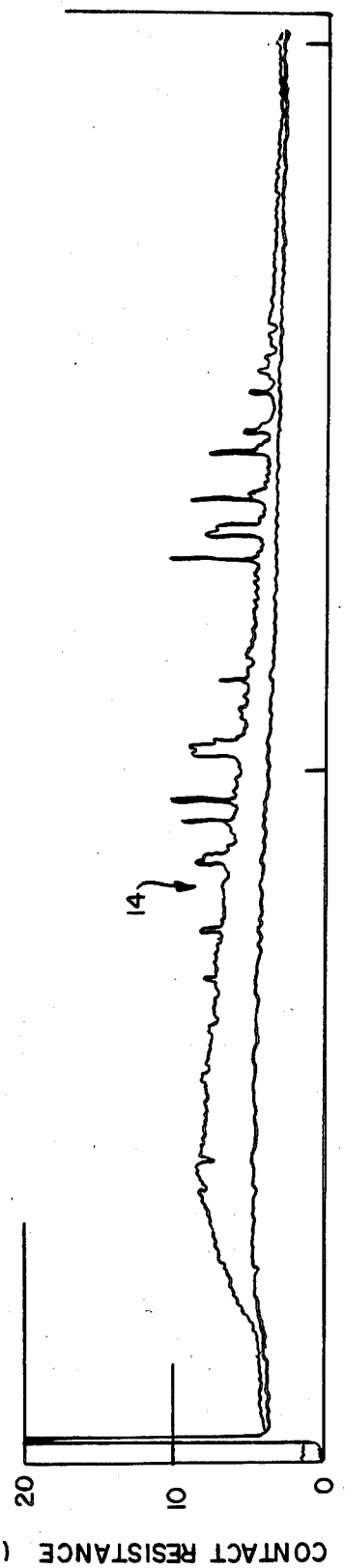
FIGS. 3 and 3A show graphs of contact resistance test results for simulated insertion and removal motions.
Figure 3A:
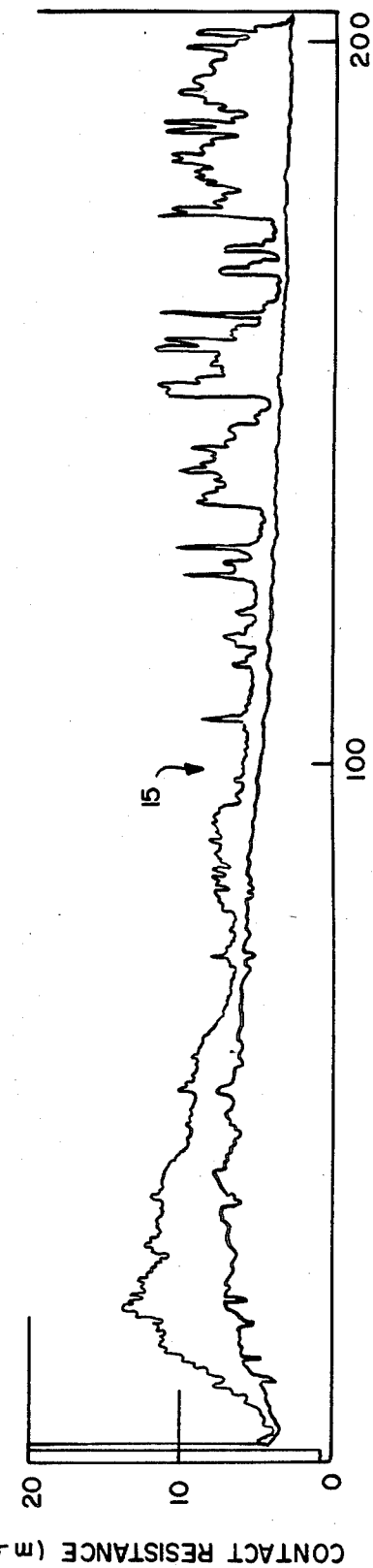

A typical surface of such a construction was tested using two kinds of simulated operating tests. A first sliding test provided an oscillating sliding motion having about a 6.0 mm amplitude at a frequency of about 1.0 Hz under a load of 200 g. for up to 200 cycles, the contact resistance being continuously measured during the test. Such test simulated the insertion and removal operations of an electrical connector. It was found that the wear debris or wear particles produced by such sliding motion between the top surface of the islands and the sliding surface in contact therewith was substantially completely trapped and retained in the depressed regions between the islands. In two particular samples tested it was found that the contact resistance never exceeded 15 milliohms (mΩ.) and accordingly remained well within the desired design limits, as shown in FIGS. 3 and 3A for the two samples tested, wherein the peaks of the resistance level excursions for each of the cycles are depicted by pen recorded curves 14 and 15, respectively.

A second test was performed to simulate conditions during use with respect to smaller amplitude and higher frequency motions (corresponding to vibration or fretting motions) in which the amplitude of the motion was about 20 μm. at a frequency of about 60 Hz. Tests on two particular samples were performed at a 200 g load for 100,000 cycles. Again it was found that the debris was adequately trapped and retained by the depressed regions on the surface of one of the contact elements and the contact resistance again stayed well below the desired maximum 25 mΩ level, as shown by pen recorded curves 16 and 17 in FIGS. 4 and 4A, respectively, for the two samples tested.

While the particular preferred embodiment disclosed above utilizes a substantially regular pattern of alternating raised and depressed portions, as shown in FIGS. 1 and 2, it is clear that in some applications it would be within the scope of the invention to change the particular pattern shown to another form of regularized pattern or to change the shape and dimensions of the islands and valleys themselves. Moreover, it is entirely possible to use an irregular pattern of such islands and valleys. Optimized patterns for each application can be well determined by those in the art utilizing the inventive concept disclosed. It is preferable that the raised portions or islands have contact surface dimensions which are less than the amplitude of the sliding motion required for insertion and removal and normally such dimensions are at least an order of magnitude less than such amplitude. Further, although a particular combination of copper, nickel and lead-tin alloy materials has been discussed with reference to preferred embodiments which were made and tested, it is clear that the type of material can be selected for the particular use desired, particularly in terms of its hardness, and such materials may include both noble and base metals and coatings therefor for the specified electrical contact applications involved.

Other modifications to the basic inventive concept as disclosed herein may also occur to those in the art within the spirit and scope of the invention. Hence, the invention is not to be limited to the particular embodiments discussed herein except as defined by the appended claims.

What is claimed is:

1. A pair of slidably contacting elements, a surface of at least one of said elements comprising a plurality of first contact portions and a plurality of second depressed portions, said contact portions forming island portions in between the valley portions formed by said depressed portions, said contact portions being in slidable contact with a contact surface of the other of said elements, the surfaces of said pair of elements which are in slidable contact being relatively moveable with respect to each other and the depressed portions of said at least one element entrapping substantially all of the wear particles generated at the contact regions between the contact portions of said at least one element and the contact surface of said other element during said relative movement by the movement of said wear particles from said contact regions into said depressed portions.

2. A pair of elements in accordance with claim 1 wherein said contact portions and said depressed portions are formed in an irregular pattern on the surface of said at least one element.

3. A pair of elements in accordance with claim 1 wherein the surface dimensions of said contact portions are less than the amplitude of the sliding motion between said elements.

4. A pair of elements in accordance with claim 1 wherein a pattern of said contact portions and said depressed portions are formed by a photo-resist process.

5. A pair of elements in accordance with claim 1 wherein a pattern of said contact portions and said depressed portions are formed by a mechanical embossing process.

6. A pair of elements in accordance with claim 1 wherein said contact portions and said depressed portions are formed in a substantially regular pattern on the surface of said at least one element.

7. A pair of elements in accordance with claim 6 wherein said contact portions and said depressed portions are each substantially rectangular in configuration.

8. A pair of elements in accordance with claim 7 wherein said contact portions and said depressed portions are each substantially square in configuration.

9. A pair of elements in accordance with claim 8 wherein said contact portions and said depressed portions are each about 100 μmeters square and said depressed portions each have a depth of about 100 μmeters.

10. A pair of elements in accordance with claim 1 wherein said contact portions include a contact surface layer of nickel.

11. A pair of elements in accordance with claim 10 wherein said contact surface layer is further coated with a layer of a lead-tin alloy.

12. A pair of elements in accordance with claim 11 wherein the thickness of said nickel layer is selected to provide a relatively low electrical resistance.

13. A pair of elements in accordance with claim 12 wherein said nickel layer is about 3.75 μmeters in thickness and said coating has a thickness within a range from about 0.1 μmeter to about 2.0 μmeters.

14. A pair of elements in accordance with claim 13 wherein said surface dimensions are at least an order of magnitude less than said amplitude.

* * * * *